United States Patent [19]

Brown et al.

[11] Patent Number: 4,933,742
[45] Date of Patent: Jun. 12, 1990

[54] METALLIZATION CONTACT SYSTEM FOR LARGE SCALE INTEGRATED CIRCUITS

[75] Inventors: Dale M. Brown, Schenectady; Bernard Gorowitz, Clifton Park; Ronald H. Wilson, Schenectady, all of N.Y.

[73] Assignee: General Electric Company, Schenectady, N.Y.

[21] Appl. No.: 151,045

[22] Filed: Feb. 1, 1988

Related U.S. Application Data

[63] Continuation of Ser. No. 714,785, Mar. 22, 1985, abandoned.

[51] Int. Cl.$^5$ ............................................. H01L 23/48
[52] U.S. Cl. ...................................... 357/71; 357/68; 357/65
[58] Field of Search ...................... 357/71, 68, 65, 67

[56] References Cited

U.S. PATENT DOCUMENTS

| | | | |
|---|---|---|---|
| 4,242,698 | 12/1980 | Ghate | 357/71 S |
| 4,582,563 | 4/1986 | Hazuki et al. | 156/643 |
| 4,622,735 | 11/1986 | Shibata | 357/71 S |
| 4,656,732 | 4/1987 | Teng et al. | 29/591 |
| 4,672,419 | 6/1987 | McDavid | 357/71 S |

OTHER PUBLICATIONS

Hewlett Packard Journal, Aug., 1983, pp. 27–30, by Mikkelson et al.

Primary Examiner—Andrew J. James
Assistant Examiner—Mark Prenty
Attorney, Agent, or Firm—James C. Davis, Jr.; Marvin Snyder

[57] ABSTRACT

A contact metal such as tungsten, platinum silicide or palladium silicide is selectively deposited or formed on the semiconductor substrate portion of an integrated circuit chip. The metallization pattern for the circuit makes contact with the contact metal at the bottom of a contact opening or via, rather than contacting the substrate directly. Thus, the interconnection metal makes contact to the semiconductor surface through an intermediate contact metal so as to provide decreased contact resistance. This permits narrower interconnect metallization patterns so as to facilitate the construction of denser integrated circuits. In the present invention, therefore, metal framing of the contact hole is not employed.

21 Claims, 17 Drawing Sheets

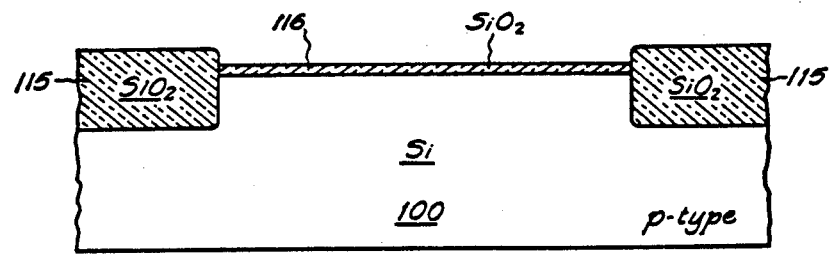
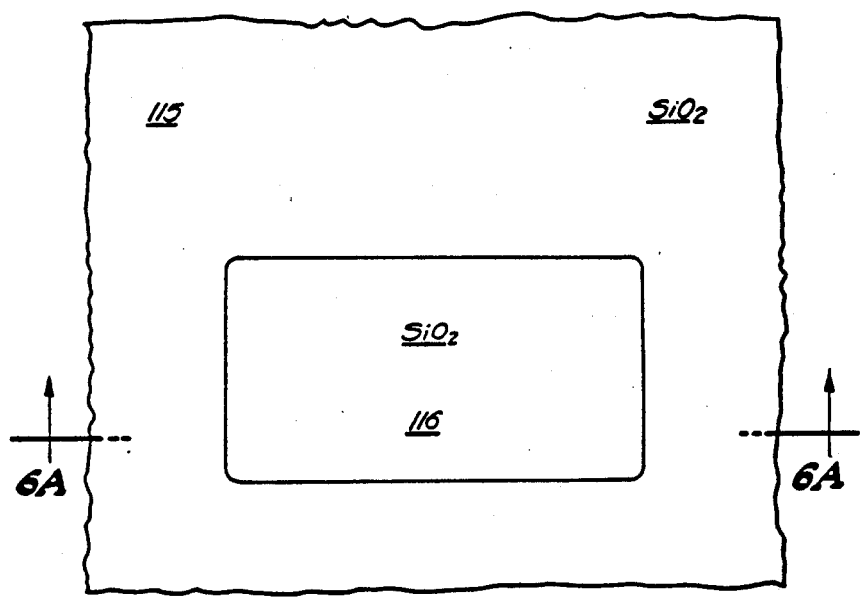
Fig. 6A
Fig. 6B

METALLIZATION CONTACT SYSTEM FOR LARGE SCALE INTEGRATED CIRCUITS

This application is a continuation of application Ser. No. 714,785, filed 3/22/85 and now abandoned.

BACKGROUND OF THE DISCLOSURE

The present invention is generally directed to a method and apparatus for increasing the density of electronic components on integrated circuit chips. More particularly, the present invention relates to a method of improving the contact resistance between a metallization layer and the semiconductor material so as to eliminate the necessity of using excessively wide metallization patterns in the vicinity of contact holes or vias.

In the manufacture of integrated circuit chips, it is typically necessary to connect semiconductor material, such as silicon, to a metallization pattern which defines interconnections among various electronic devices on the circuit chip. This interconnection is made through contact holes or vias in a dielectric layer. To ensure that the interconnecting metal contacts as much of the semiconductor material at the bottom of the via as possible, the interconnecting metal pattern is provided with frames or buffer areas which totally surround the contact opening. By providing as large a contact area as possible, contact resistance is kept low. Furthermore, since the metal frame edges are over $SiO_2$, etching of the metal pattern eliminates any possibility of etching the silicon at the bottom of the via. If such etching should occur, the shallow diode could be affected, since plasma etching of aluminum will also etch silicon. Alternatively, rather than providing metallization frames around each contact opening it is also possible to achieve the same effect simply by providing sufficiently wide metallization patterns. In either case, the object is to have the metallization pattern completely cover the contact opening. However, both of these methods of solving a contact resistance problem result in metallization patterns which are wider than necessary. More particularly, such wide metallization patterning places unnecessary limits on the circuit packing density. Moreover, even if interconnect metallizations were simply made narrower, it is noted that alignment problems for narrow interconnection metallization patterns are much more severe. For example, the use of narrow interconnect metal patterns generally requires precise alignment of the metallization over the contact opening. With narrow patterning, partial rather than complete contact with the underlying semiconductor material results in a significant increase in contact resistance.

Accordingly, it is seen that it is desirable for high packing density to not require that interconnection metal cover or frame the contact openings. This objective can be met by improved contact conductivity between the metallization and the semiconductor material. This also relaxes the alignment requirements considerably since the interlevel metallization mask need not be aligned perfectly with the contact window pattern.

When the interconnection metal does not cover the contact holes, there is a danger that etching of this metal will also remove a portion of the material at the bottom of the hole. Most etchant gasses that are used for delineating metal patterns will etch silicon which is typically at the base of such contact holes. It is, therefore, also desirable to have a metal which can serve as an etch stop to prevent this damage.

SUMMARY OF THE INVENTION

In accordance with a preferred embodiment of the present invention, tungsten, platinum silicide or palladium silicide is selectively deposited or formed directly on the semiconductor material. The fact that the deposition is selective to this area of the chip (as opposed to oxide portions) is essential to the practice of the present invention. The metal which is selectively deposited forms an intermediary contact metal with the underlying semiconductor material. For example, in the manufacture of metal oxide semiconductor field effect transistors (MOSFETs), the contact metal is selectively deposited on source, drain, and gate regions. This contact metal acts as an intermediate connection material between the interconnect metallization layer and the semiconductor substrate. However, because the intermediate contact metal is in such good electrical contact with the underlying semiconductor material, greater flexibility is permitted in terms of positioning, sizing, and alignment of the interconnection metal patterns. In particular, the contact resistance between the intermediary contact metal and the interconnect metal is so low as to permit narrow patterns without metallization frames which were formerly required to completely cover the contact window. Moreover, the presence of an intermediate connection metal, particularly tungsten, at the bottom of a contact via prevents etching material from reaching doped silicon regions.

In this regard, the intermediate connection metal serves as a desirable barrier to prevent etching of the base of the contact hole while etching the interconnect metal.

Accordingly, it is an object of the present invention to provide lower contact resistance between an interconnection metallization layer and a semiconductor layer in an integrated circuit chip.

It is also an object of the present invention to provide interconnection metallization patterns for electrical circuit chips which do not require metallization framing around contact openings.

It is yet another object of the present invention to provide more densely packed electronic devices.

It is also an object of the present invention to provide integrated circuit devices having interconnect metallization line widths which are narrower than the widths of the contact openings.

It is also an object of this invention to provide an etch stop to prevent damage to the contact hole.

Lastly, but not limited hereto, it is an object of the present invention to provide a simple and economical method for the manufacture of very large scale integrated (VLSI) circuit devices.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 1–14 illustrate cross-sectional and plan views of various stages in the manufacture of a single electronic component on an integrated circuit chip;

DETAILED DESCRIPTION OF THE INVENTION

The present invention is best understood in the context of the process steps involved in integrated circuit manufacture, particularly, the manufacture of large scale integrated circuits. Accordingly, FIGS. 1-14 are included herein to provide a context which is appropriate for best understanding the present invention. It should be appreciated, however, that the cross-sectional views shown herein are particularly exaggerated in the vertical direction for purposes of illustration and clarity. Furthermore, while certain methods are described herein for the performance of the various process steps, it is well understood by those skilled in the large scale integrated circuit arts that other chemicals, materials, and process steps act in substantially the same way to produce results similar to those illustrated in the sequence of figures provided herein. It is also noted that the sequence of figures and accompanying description is particularly directed to the fabrication of a single electronic device on but a small portion of the circuit substrate. For purposes of illustration, the device produced is a MOSFET in which the source and gate are tied together. However, with modifications to the process illustrated, which are well understood by those skilled in the art, the manufacture of complementary, or CMOS, MOSFETs and other devices is possible. It should be noted, however, that the process described herein is exemplary and that the method and means of the present invention is not limited thereto.

Figure 1:
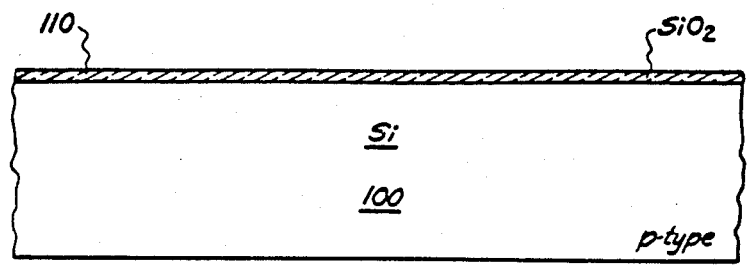

FIG. 1 illustrates the initial step in the manufacture of typical MOSFET integrated circuit chip in which a thin layer of silicon oxide 110 is grown on an underlying substrate of crystalline silicon 100. For the process described herein, silicon substrate 100 comprises a crystalline lattice doped with p-type dopants. Typically, substrate 100 is in the form of a three or four inch diameter wafer on which a plurality of independent chips are produced. Silicon oxide layer 110 is typically approximately 300 angstroms thick. This layer is formed by exposing silicon substrate 100 to oxygen at a high temperature. As is conventionally known, time and temperature determine the thickness of this oxide layer.

Figure 2:
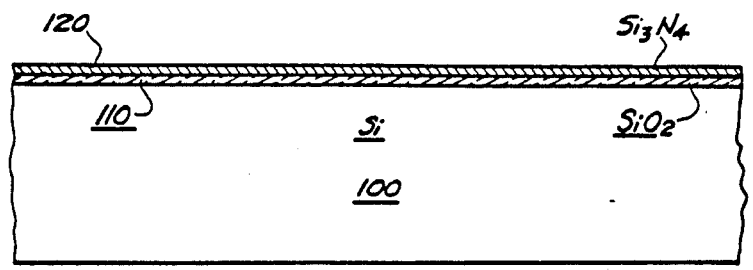

In FIG. 2, it is seen that thin layer 120 of silicon nitride, $Si_3N_4$, about 800 to 1,000 angstroms thick, has been deposited on oxide layer 110. Nitride layer 120 is typically deposited by chemical vapor deposition (CVD). For example, this deposition may be accomplished by exposing the wafer to a mixture of silane and ammonia gases in high temperature oxygen free atmosphere. Alternatively, low temperature plasma deposition processes operating between about 400° C. and 500° C. may be employed.

Figure 3B:
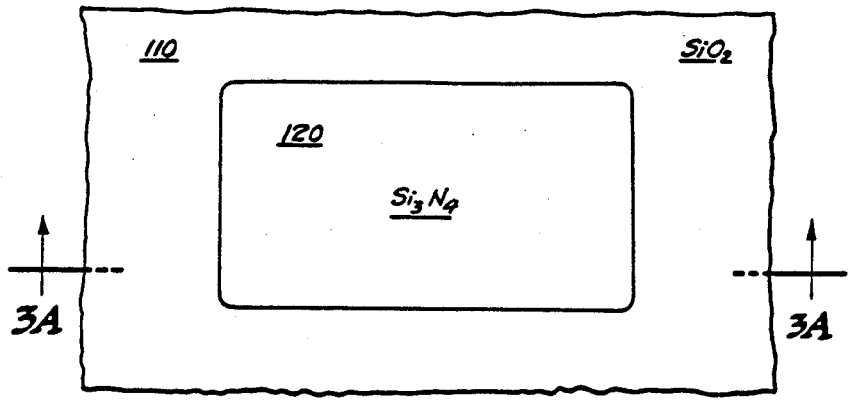
Figure 3A:
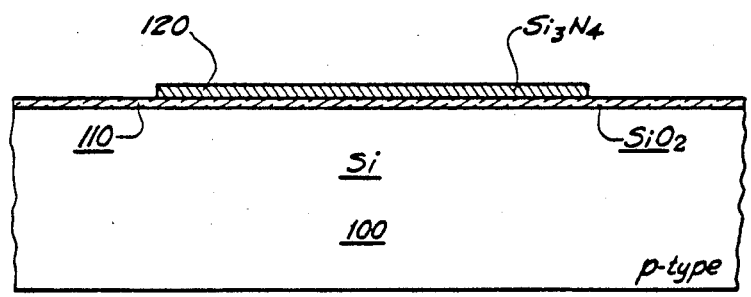

In FIGS. 3A and 3B, it is seen that nitride layer 120 has been selectively removed from certain portions of the chip surface. More particularly, nitride layer 120 is patterned into substantially rectangular regions which will eventually function as the active area for the device on the chip. The selective patterning of nitride layer 120 is performed using a masking process. Although not specifically illustrated herein since they are well known to those skilled in the art, such masking steps involve coating the substrate with a photoresist, exposing the photoresist through a circuit mask, removing portions of either exposed or unexposed photoresist material, and then selectively etching through the openings in the photoresist to remove the layers immediately beneath it to produce the desired pattern. It should be appreciated that both positive and negative masking processes exist, there being a cooperative relationship between the mask patterns, the photoresist material and its developing agents. In any event, a pattern such as is seen in FIGS. 3A and 3B is readily produced. FIG. 3A illustrates in cross-section the resultant pattern and materials while FIG. 3B provides a plan view of the so-called active area pattern.

Figure 4A:
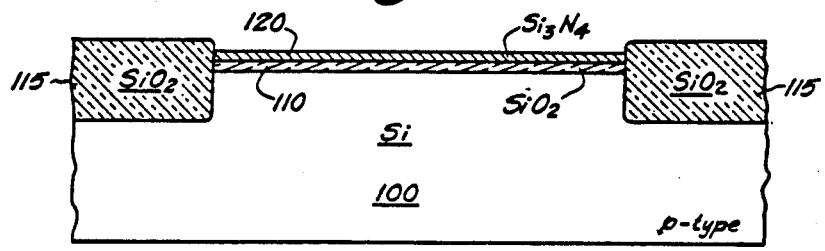
Figure 4B:
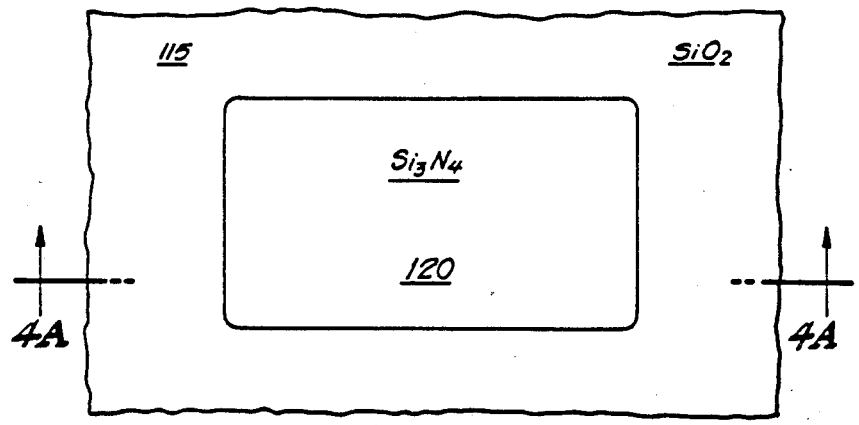

In FIGS. 4A and 4B, it is seen that oxide layer 115 is grown on the surface of the chip in those areas which are not covered by nitride layer 120. The resultant oxide layer 115 is referred to as the field oxide. Its silicon oxide composition provides layer 115 with its desired insulating properties. As can be seen, in FIG. 4A, the formation of oxide layer 115 results in a growth in both directions (up and down) from the substrate surface. The formation of the field oxide is typically accomplished by heating the substrate in an oxygen or oxygen rich atmosphere at a high temperature, typically greater than about 1,100° C. for a relatively long period of time. In fact, the formation of the field oxide is generally one of the more time consuming steps in integrated circuit manufacture. The depth of layer 115 is controlled by time, temperature, and oxygen concentration. The variables are particularly controlled so as to produce an oxide layer which is approximately 5,000 angstroms thick. Typically, this layer extends to a depth of 2,500 angstroms below the original upper surface of substrate 100. No mask operation is required for the formation of the field oxide since nitride layer 120 acts to prevent oxygen penetration to what will become the active area beneath it. FIGS. 4A and 4B illustrate the cross-sectional and plan views of the resulting structure, respectively.

Figure 5A:
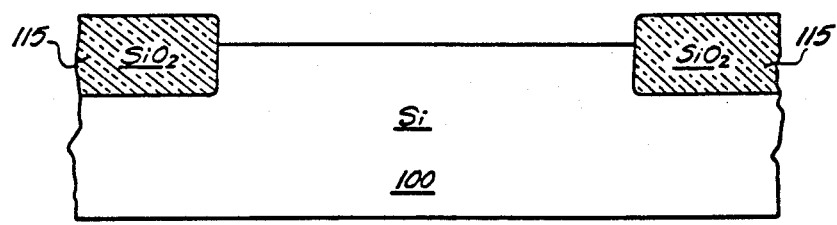
Figure 5B:
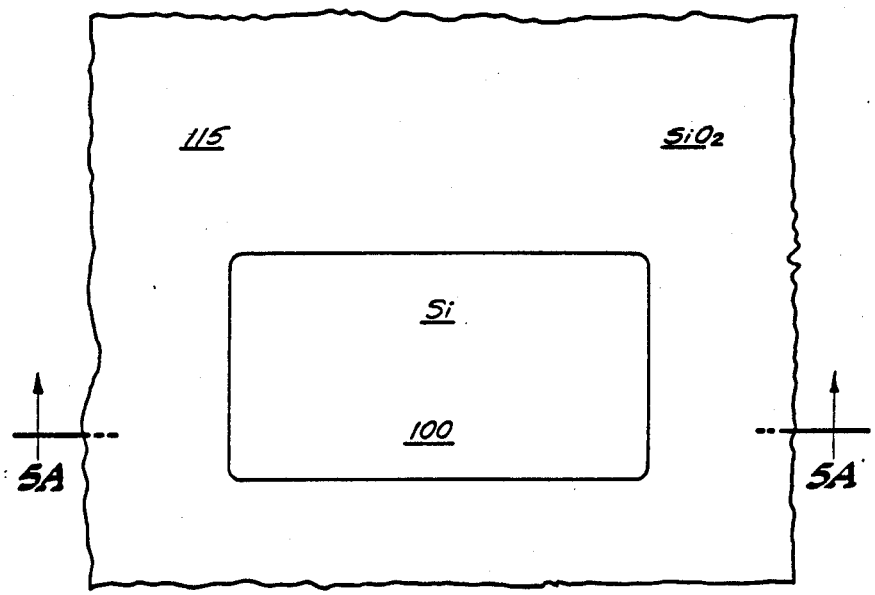

In FIGS. 5A and 5B, it is seen that nitride layer 120 and thin oxide layer 110 have been removed. Typically, nitride layer 120 is removed by etching with a phosphoric acid solution. Alternatively, it may be removed by plasma etching in an atmosphere of carbon tetrafluoride. In a typically distinct process step, oxide layer 110 is removed by placing the wafer in a hydrofluoric acid solution for a relatively short period of time. While this process step removes some of the field oxide, it is noted that oxide layer 110 is typically about only one-tenth as thick as field oxide layer 115. FIGS. 5A and 5B provide cross-sectional and plan views, respectively, illustrating the results of this two step nitride and oxide removal process.

In FIGS. 6A and 6B, it is seen that oxide layer 116 has been grown in the active area of the device. As above, this oxide is grown by exposing the wafer to oxygen at a high temperature for a predetermined period of time. Oxide layer 116 formed in this manner provides the insulating oxide which lies under the gate of the MOSFET device described herein. Typically, the thickness of gate oxide layer 116 is about 300 angstroms or less. FIGS. 6A and 6B illustrate in cross-sectional and plan view, respectively, the device structure which results from this process step.

Figure 7A:
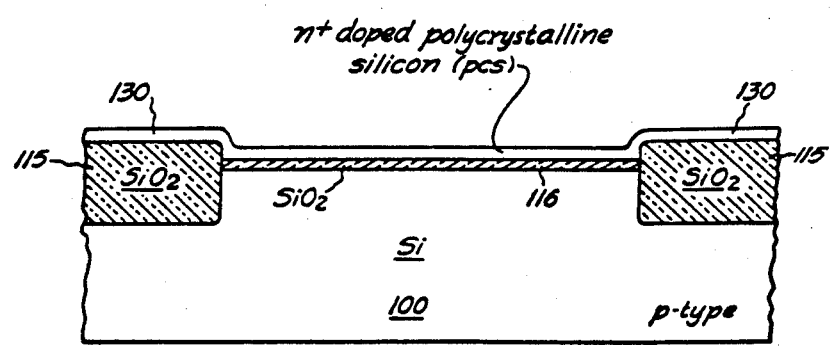
Figure 7B:
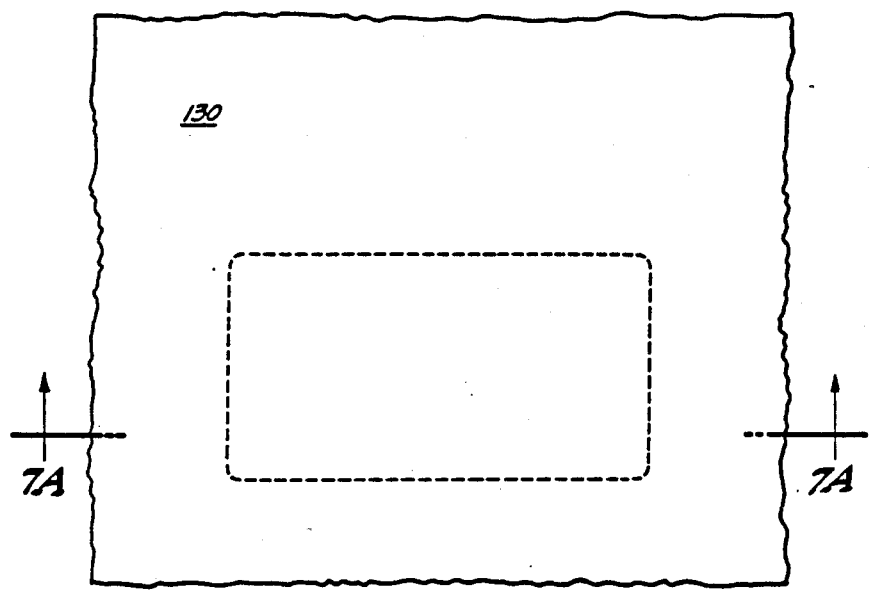

In FIGS. 7A and 7B, it is seen that the entire substrate is coated with a heavily-doped layer of polycrystalline silicon. The deposition of polycrystalline silicon, typically referred to simply as "poly", may be accomplished by exposing the wafer to silane, $SiH_4$, or dichlorosilane, $SiH_2Cl_2$, at a high temperature, typically between about 700° C. and about 900° C. The polycrystalline silicon is then typically heavily doped to provide a conductive layer. Polycrystalline layer 130 eventually forms the gate electrode and it is desired that this structure exhibit relatively low resistivity. Doping of polycrystalline layer 130 may be accomplished by exposing it at high temperature to $POCl_3$ gas and then stripping the resulting top layer of glazing by a brief (15 second) exposure to hydrofluoric acid. It is also noted herein that one variant of MOSFET manufacture employs a conductive metal rather than silicon as a gate electrode material. FIGS. 7A and 7B illustrate cross-sectional and plan views of the structure which results from the formation and doping of polycrystalline silicon layer 130.

Figure 8A:
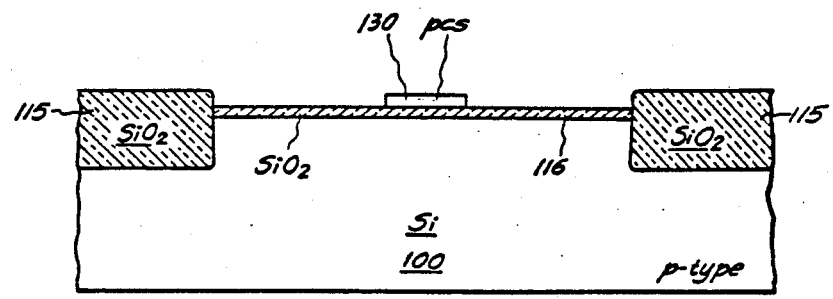
Figure 8B:
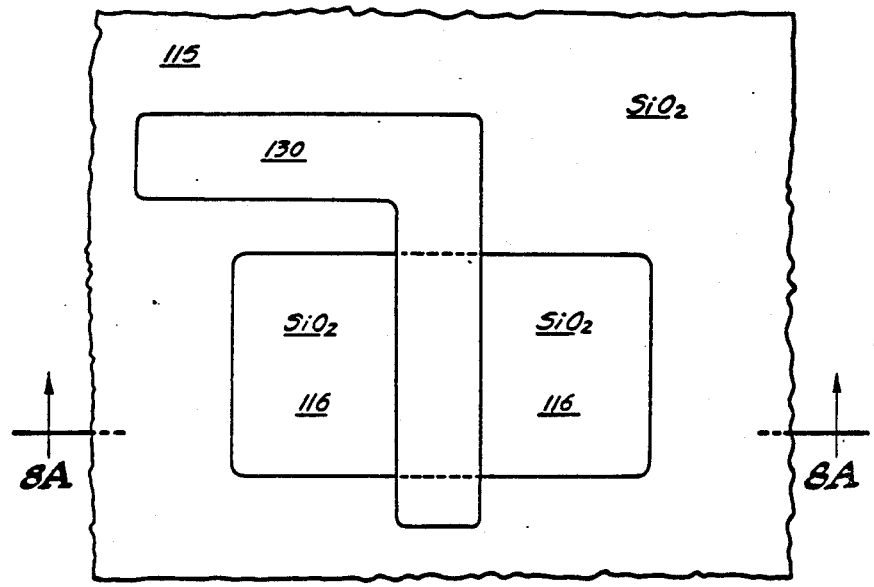

After the doped polycrystalline layer 130 has been formed, gate electrode patterning is performed. The result of this patterning process, typically accomplished in a second masking operation, is illustrated in FIGS. 8A and 8B. In any conventional processes, the gate electrode patterning is such that the active area is divided into two distinct areas, one of which eventually becomes the source and the other of which eventually becomes the drain region of a MOSFET device. While FIG. 8B indicates that the gate electrode area 130 has a relatively short extent in the horizontal and vertical directions, it should be noted that in certain device configurations the polycrystalline gate material is actually employed to connect adjacent active area portions. For example, this might be the case in CMOS memory circuits. FIGS. 8A and 8B illustrate the cross-sectional and plan views of a resulting sample gate electrode structure occurring as a result of a typical masking and etching operation, such as was described above with respect to formation of the nitride patterns.

Figure 9:
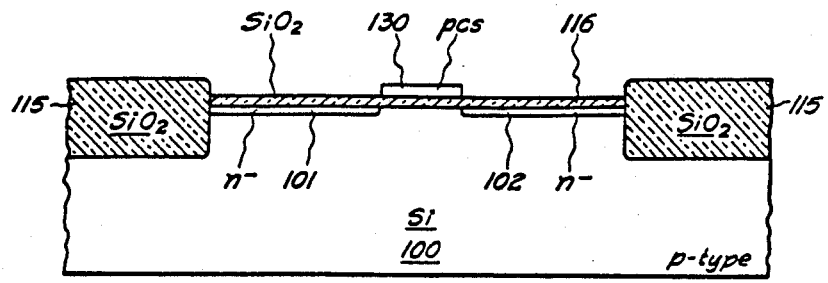
Figure 10A:
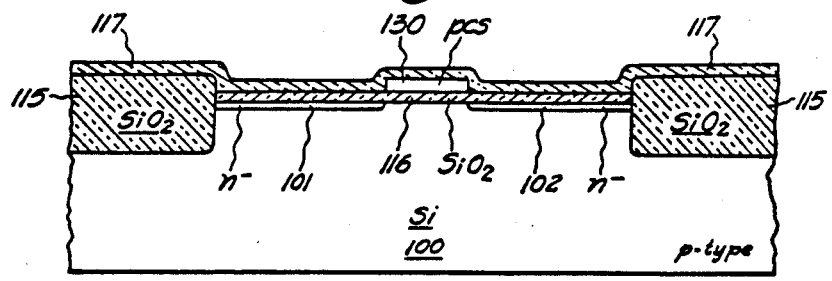
Figure 10B:
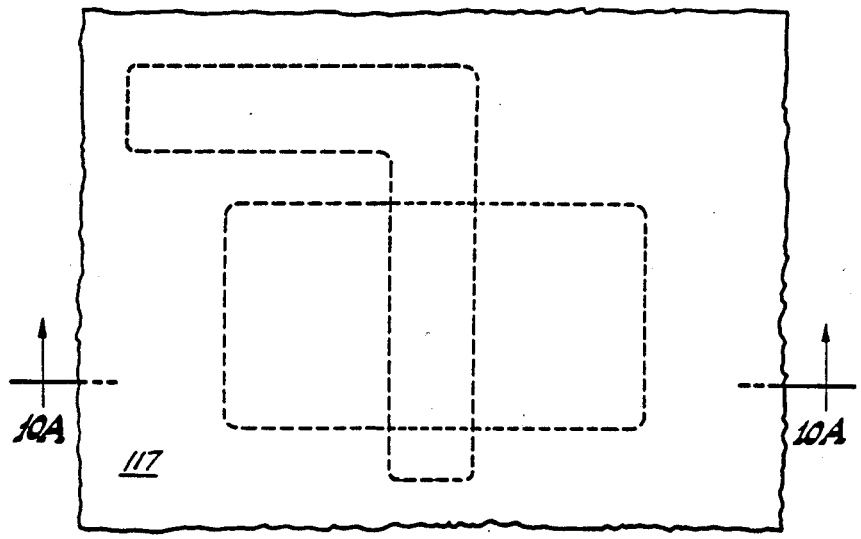

In order to provide a graded source and drain region, a light ion implantation of dopant atoms is now carried out. The light ion implantation is carried out so as to penetrate thin oxide layer 116. This oxide layer acts as an implantation screen to avoid ion implantation channeling effects and to provide a more uniform distribution of dopant ions in substrate 100. This ion implantation operation is typically carried out without masking operations. However, it is noted herein that some masking is typically involved if the circuit chip contains CMOS device components. At this stage, the ion implantation is relatively light and shallow. It typically injects dopant atoms at a concentration of approximately $10^{13}$ atoms per square centimeter. Such light implantation may, for example, be carried out at an applied voltage of approximately 90 kV. For negative ion doping, atoms such as arsenic or phosphorous may be employed to produce the thin $n^-$-doped regions 101 and 102, as shown in FIG. 9. It is noted that this region extends from the field oxide to the region immediately beneath the edges of the polysilicon gate. Doped region 101 eventually operates as part of the source region while doped region 102 eventually operates as a part of the drain region of the resulting MOSFET device. However, it should be understood that the source/drain symmetry of such devices often permits a certain amount of interchangeability in circuit designs and layout patterns.

At this point in the processing, a layer of silicon oxide is deposited on the surface of the wafer. The deposited oxide has a thickness which is approximately equal to the thickness of polycrystalline silicon layer 130 to form oxide layer 117. In the present process, it is noted that this oxide layer is deposited, not grown on the wafer. For example, it may be deposited by chemical vapor deposition by exposing the wafer to a mixture of silane and oxygen or dichlorosilane and oxygen at a relatively high temperature for example, at least 900° C. The advantage of this chemical vapor deposition process step is that an oxide layer is formed which closely mimics the underlying surface, especially at step discontinuities such as those found at the edges of the polycrystalline gate electrode pattern. The result of the silicon oxide deposition process step is illustrated in cross-section in FIG. 10A and in a plan view in FIG. 10B.

Figure 11A:
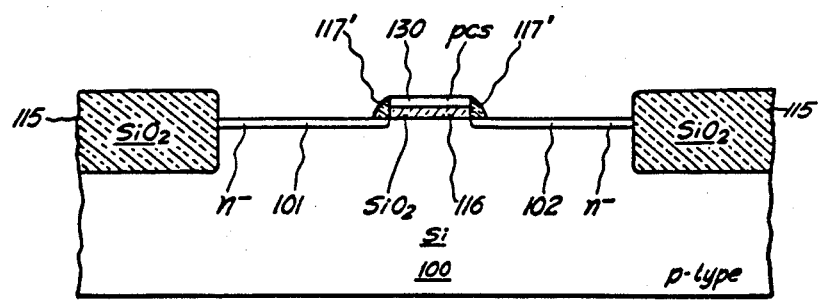
Figure 11B:
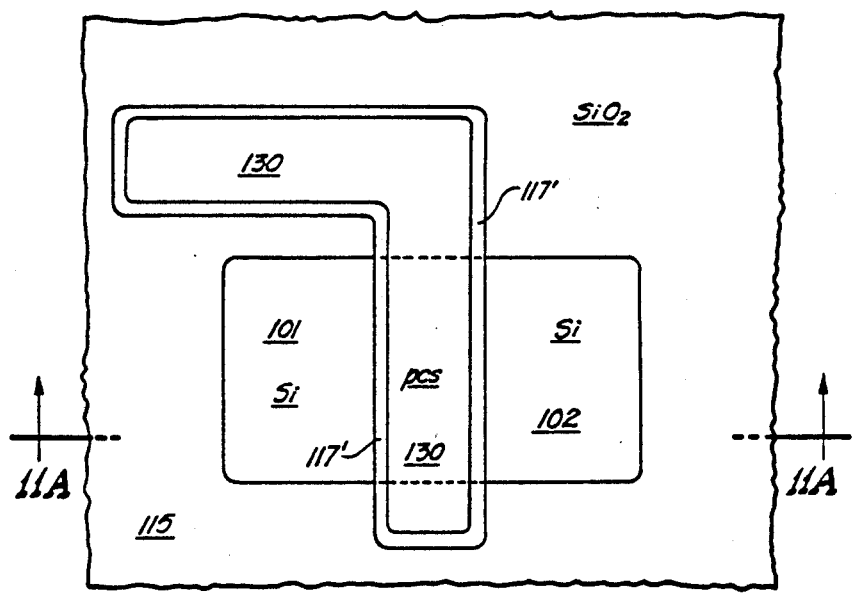
Figure 12A:
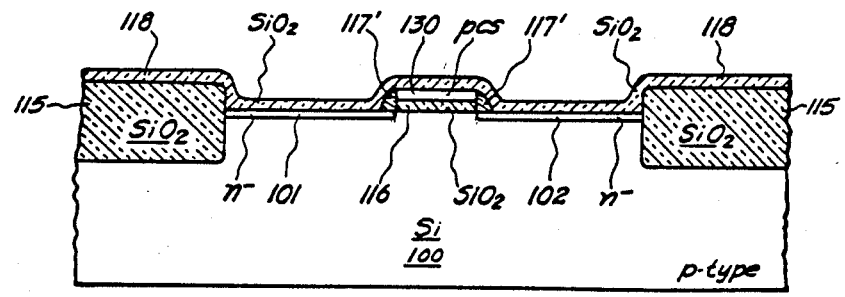
Figure 12B:
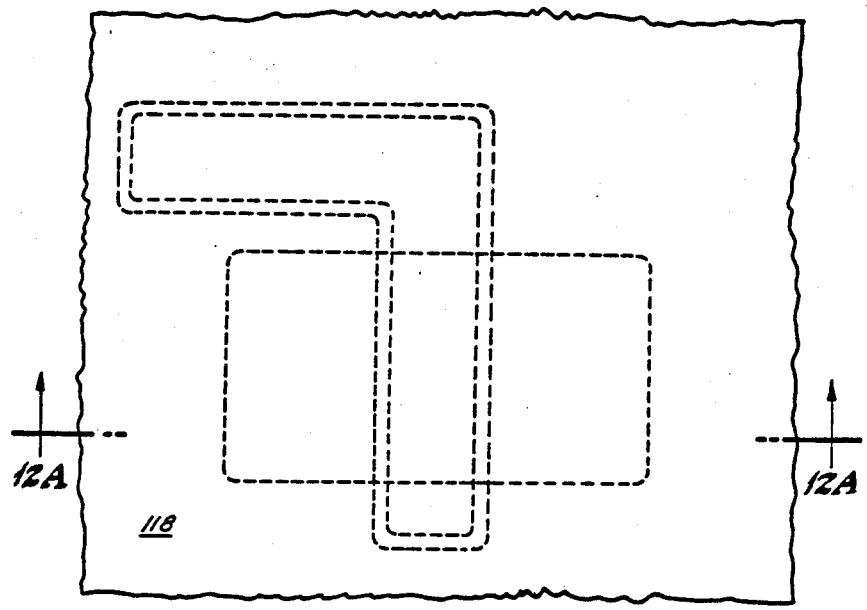
Figure 13:
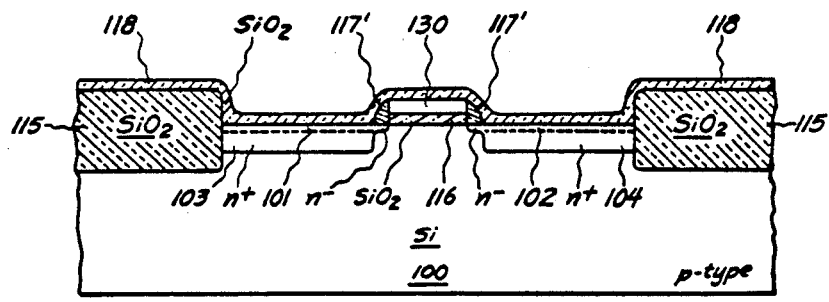

The next process step in the present example constitutes a reactive ion etching of oxide layer 117. In reactive ion etching, the wafer being processed is typically disposed between electrically conductive plates between which an etching gas such as trifluoromethane is turned into a plasma by high frequency AC voltages being applied to the plates; additionally, a DC bias field is also simultaneously applied. The principle advantage of reactive ion etching is that it acts anisotropically. More particularly, the reactive ion etching process carried out to remove oxide layer 117 also produces silicon oxide shoulders or spacers 117' shown in FIG. 11A on either side of the gate structure. As seen in FIG. 11A, the gate structure includes a portion of oxide layer 116 together with a portion of polycrystalline layer 130. It is this gate structure of Metal (or, in this case, conductive semiconductor), Oxide and Semiconductor in the gate region which gives the device its "MOS" designation. In the present invention, it should be particularly pointed out that insulating oxide shoulders 117' provide a very desirable insulating function. If these oxide shoulders were not present, oxide layer 116 would have to be much thicker to prevent the application of the contact metal (to be discussed below) from short circuiting the source, drain, and gate regions. Reactive ion etching processes also offer better etchant selectivity. The existence of shoulders 117' are also the result of proper timing constraints imposed upon the reactive ion etching process. FIGS. 11A and 11B illustrate cross-sectional and plan views respectively, of the device structures that result from this process step. The presence of gate shoulders 117' is particularly important in n-channel MOSFETs because of relatively high electric field regions which can exist at the edges of the gate electrode material.

Next, thin oxide layer 118 is formed over the surface of the wafer. This oxide is formed as above typically by exposure to oxygen at high temperature. This oxide layer functions as a ion implantation screen. In addition to the ion implantation screen functions described above, these screens also particularly operate to trap contaminant ions such as iron which may be present as a pollutant material from process vessel walls. However, as above, it also avoids channeling effects that might otherwise occur in the more regular crystalline structure of substrate 100. It is noted that oxide layer 118 is typically grown, rather than being deposited. The resulting structure is illustrated in cross-section in FIG. 12A and in plan view in FIG. 12B.

Next, the principle ion implantation process step is performed to complete the formation of the source and drain regions. This ion implantation step typically provides dopants at a concentration of about $8 \times 10^{15}$ atoms per square centimeter to the source and drain regions. As above, masking operations are not required for this implantation except for the case of p-channel devices, such as may be found in CMOS circuits. This heavier ion implantation dosage produces $n^{30}$-doped regions 103 and 104, as shown in cross-section in FIG. 13. Regions 101 and 103 operate together as a source region and regions 102 and 104 operate together as a drain region for the MOSFET device shown. Note that the more heavily doped regions 103 and 104 only extend from field oxide 115 to the region immediately beneath the edges of spacers 117' while regions 101 and 102 extend from field oxide 115 to the region beneath gate electrode 130. This, in effect, provides for graded fields in the gate region.

Figure 14:
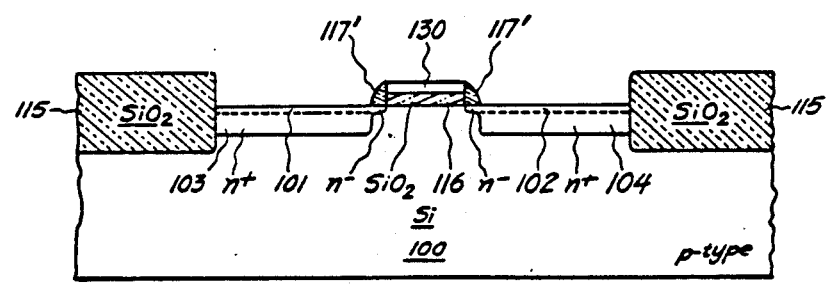

Next, screen oxide layer 118 is removed, for example, by immersing the wafer in a buffered hydrofluoric acid solution. A typical buffering agent, for example, might comprise ammonium fluoride NH$_4$F. The cross-section of the resulting structure with oxide layer 118 removed is shown in FIG. 14.

Figure 15A:
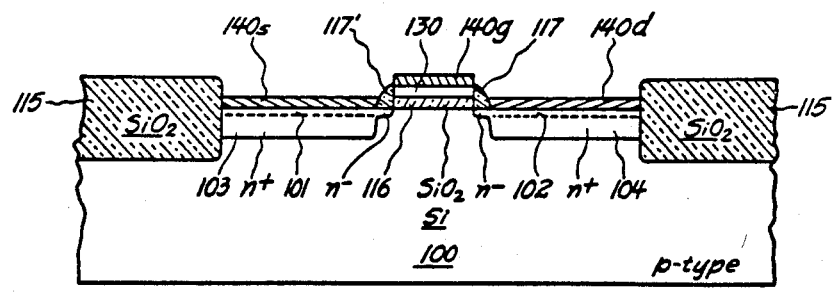
FIGS. 15A and 15B illustrate cross-sectional and plan views, respectively, of selective contact metal deposition in the present invention.
Figure 15B:
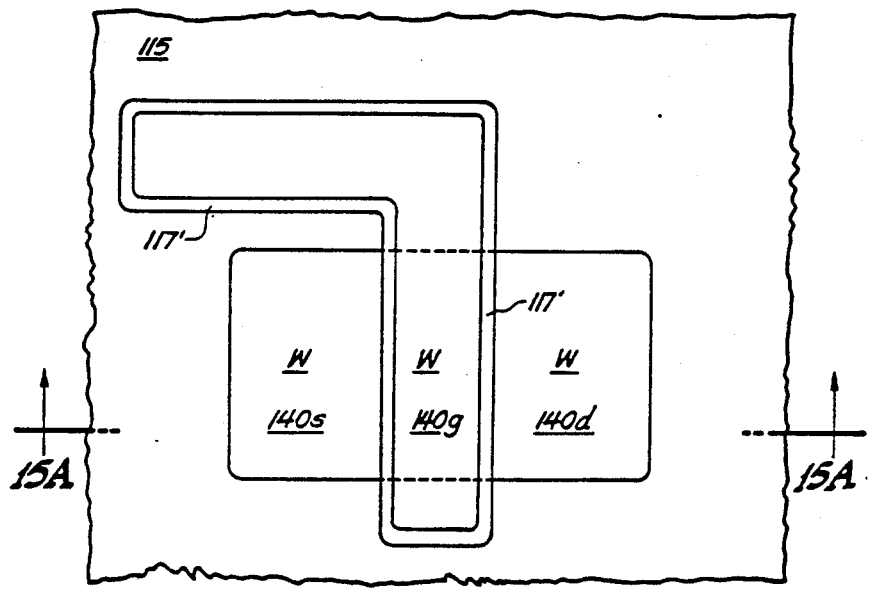
Figure 20:
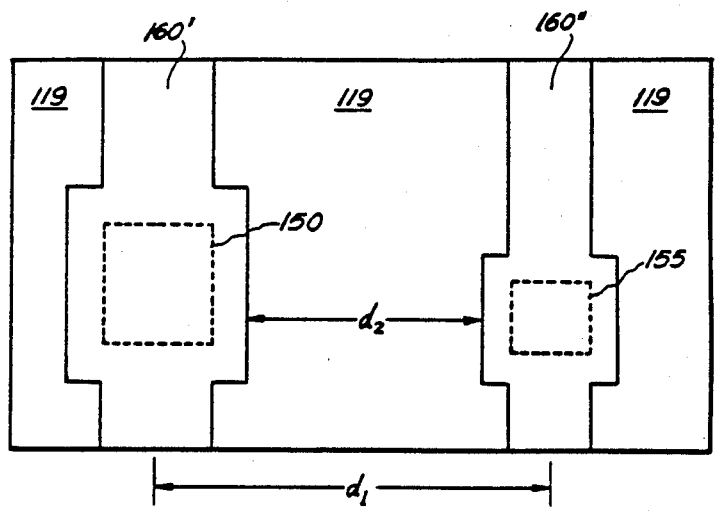
FIG. 20 illustrates in plan view the framed contact metallization of prior art devices.

The next step in the process is critical to an understanding of the present invention. In fact, the next step in the process is essential for the practice of the present invention, with much of the process description presented so far being merely background and context material for the understanding of the structures that result, particularly those structures shown in FIG. 14. More particularly, tungsten is deposited by chemical vapor deposition on the silicon portions of the substrate. It is important and crucial to the operation of the present device that this deposition be selective. It is thus seen in FIGS. 15A and 15B that the selective deposition of tungsten on the source, drain, and gate silicon areas operates to separately coat these regions. Accordingly, contact metal layer 140 is designated 140s, 140g, or 140d, depending upon whether the metal is deposited upon the source, gate, or drain regions, respectively. The selective deposition of tungsten on the silicon portions of the substrate and not on the silicon oxide portions of the substrate is accomplished by heating the wafer in the presence of an atmosphere comprising tungsten hexafluoride and hydrogen. Under these conditions, the tungsten is selectively deposited only on the silicon or polysilicon regions. Exposed oxide regions are not deposited with tungsten to any significant degree. In this regard, it is particularly noted that insulating gate shoulders 117' perform an essential insulating role in all conditions in which gate oxide layer 116 is relatively thin, as is conventionally desired for fast operating MOSFET devices. Since the tungsten deposition is selective, no masking step is required. The deposition of tungsten over the source, drain, and gate regions, and particularly in the source and drain regions, provides a mechanism for narrowing the patterns for a subsequent layer of interconnection metal, as is more particularly described below, especially with respect to FIGS. 20 and 21.

In addition to selectively depositing tungsten over the source and drain regions to form the desired metal to silicon contact, another method of forming an unframed contact is to use platinum silicide or palladium silicide as the contacting material since most other metals can be etched preferentially over such silicides as long as fluorine compounds are avoided. However, a disadvantage of platinum or palladium silicide as a contacting material is that its formation at the bottom of the contact hole is more complicated and requires deposition, specialized sintering, and aqua regia or other wet chemical etching. Accordingly, the refractory chemical vapor deposition of tungsten described above is preferred. In any event, the resultant structure showing the inclusion of contact metal in accordance with the present invention is illustrated in cross-section in FIG. 15A and in a plan view in FIG. 15B.

Figure 16A:
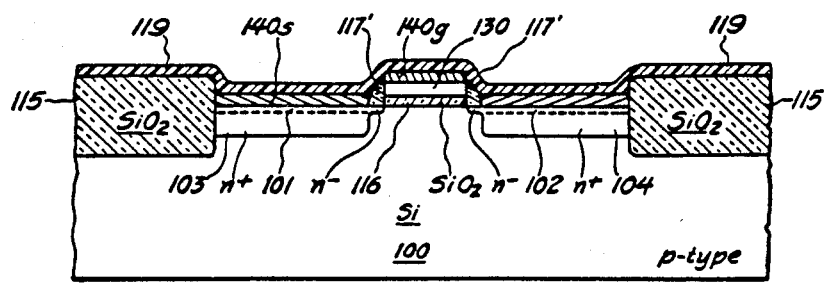
FIGS. 16A and 16B illustrate cross-sectional and plan views, respectively, more particularly describing the deposition of a dielectric layer.
Figure 16B:
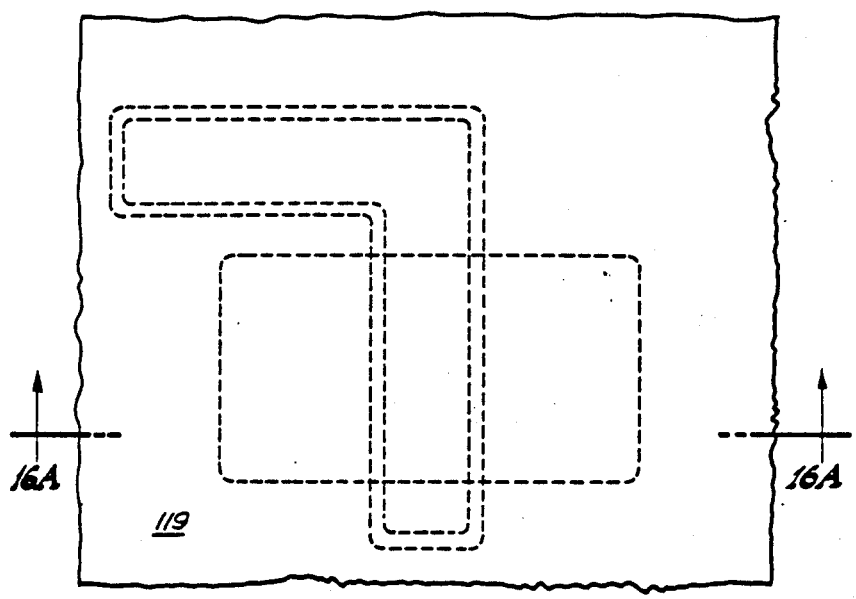

Next, interdielectric layer 119 is applied to the wafer. Layer 119 typically comprises a layer of silicon oxide or a mixture of silicon oxide and silicon nitride either of which is typically deposited by chemical vapor deposition. In particular, for deposition of a silicon nitride layer, low temperature plasma enhanced depositions may be employed at temperatures of approximately 400° C. Interlayer dielectric 119 provides the essential means for insulating interconnection metal patterns from the various devices on a circuit chip or wafer. Interlevel dielectric layer 119 is typically between about 4,000 and 5,000 angstroms thick. The resulting structure with interlayer dielectric in place is illustrated in cross-sectional view in FIG. 16A, and in plan view in FIG. 16B.

Figure 17A:
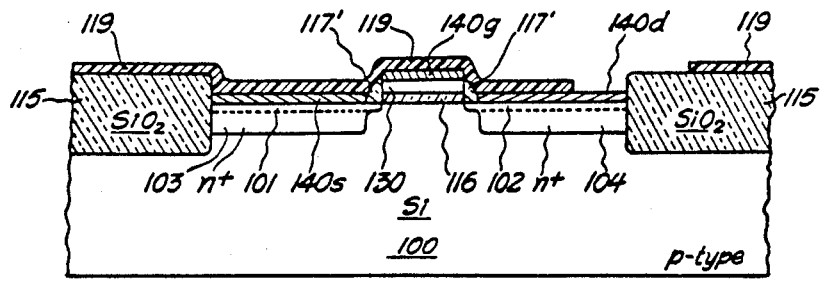
FIGS. 17A and 17B illustrate cross-sectional and plan views, respectively, of the contact openings or vias provided in the dielectric layer.
Figure 17B:
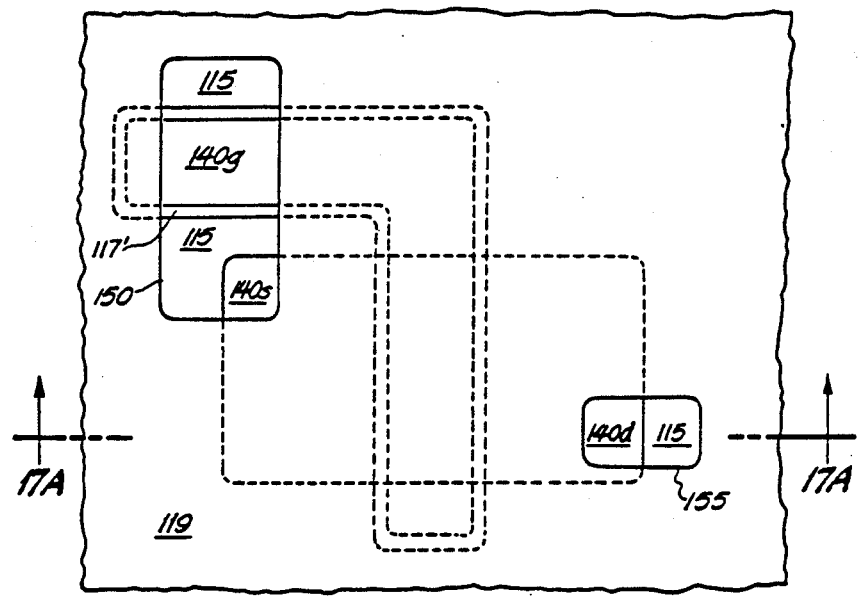

The next step that is performed in the fabrication process is the cutting of via holes, "windows" or contact holes in dielectric layer 119. This step is typically a step which requires a masking operation. In the process described so far herein, this is the third masking step that is required. As in all of the masking operations for very large scale integrated circuits, mask alignment becomes more critical with shrinking dimensions. However, because of the presence of contact metal, in particular, contact metal 140s and 140d (seen through contact holes 150 and 155, respectively, in FIG. 17B) the criticality of the mask needed for cutting holes in the dielectric layer is reduced. This is a direct result of the low resistance contact which can be formed using the contact metal as an intermediary conducting medium which provides not only excellent contact to the underlying silicon, but also to the subsequent interconnection metallization layer (160 below). Contact holes or windows 150 and 155 may, for example, be formed after masking and photoresist development, by etching processes involving plasma etching or reactive ion etching. Reactive ion etching and plasma etching are similar processes except that, in a reactive ion etching process, a DC bias field is provided to accelerate etchant atoms in a selected direction so as to enhance its anisotropic effects. These anisotropic effects significantly reduce the occurrence of photoresist undercutting. FIGS. 17A and 17B illustrate, in cross-sectional and plan views respectively, the structures resulting from the formation of via holes in interlayer dielectric strata 119.

Figure 18A:
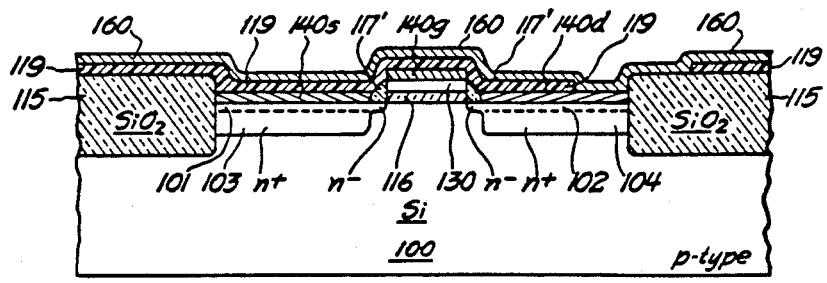
FIGS. 18A and 18B illustrate cross-sectional and plan views, respectively, showing the deposition of an interconnect or metallization layer.
Figure 18B:
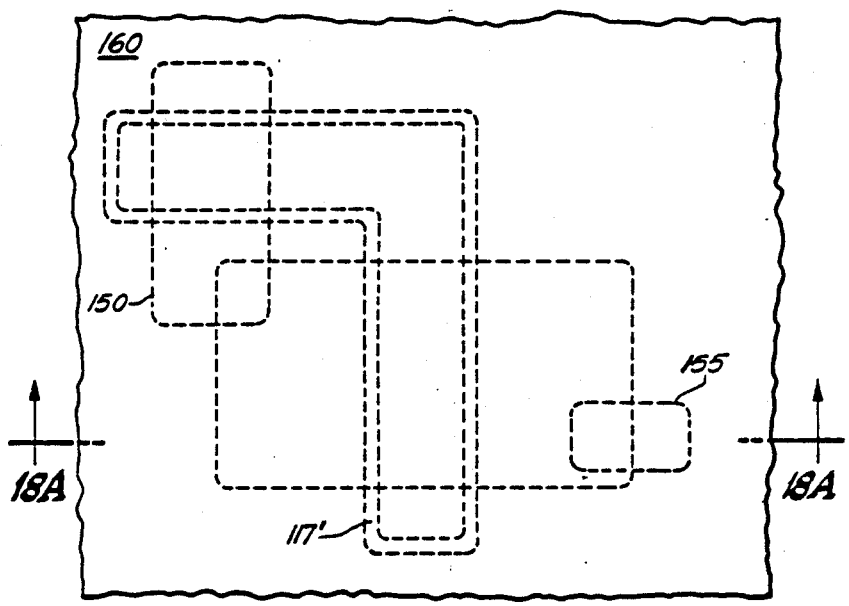

Next, interconnect metal layer 160 is disposed as the next layer of the device chip or wafer. This may be accomplished by sputtering, evaporation, or chemical vapor deposition. It is a non-selective process step. The interconnect metal may comprise such materials as aluminum, titanium, tungsten or molybdenum or appropriate alloys thereof. In a sputtering process, a gas such as argon is often employed to enhance deposition of the sputtered metal onto the surface of the wafer. Aluminum is typically a standard metal used for the interconnect layer in large scale integrated circuits. It is noted in FIG. 18B that interconnect metal layer 160 is in electrical contact with source contact metal 140s and drain contact metal 140d. It is also noted that contact window 150 is sized and positioned so as to overlap a portion of the gate electrode which extends to the left in FIG. 17B so that interconnect metal 160 also makes contact to gate metal 140. It is still further noted, that if necessary, separate vias could be formed. In any event, FIGS. 18A and 18B provide cross-sectional and plan views of the structure that results from the deposition of interconnection metallization layer 160.

Figure 19A:
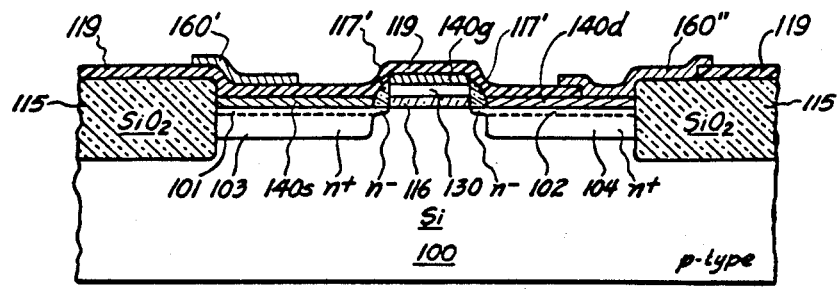
FIGS. 19A and 19B illustrate cross-sectional and plan views of metallization patterns in accordance with the present invention.
Figure 19B:
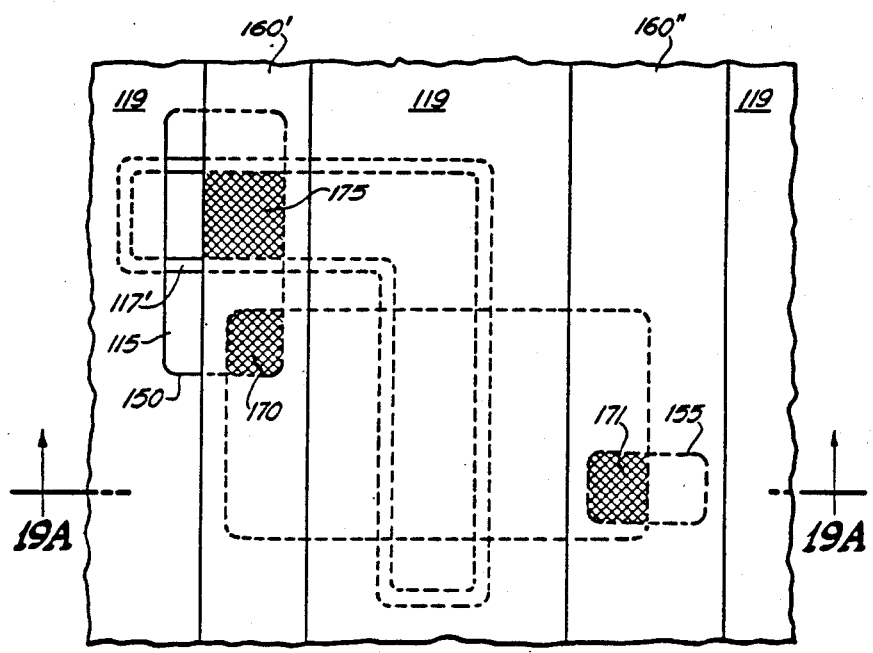
Figure 21:
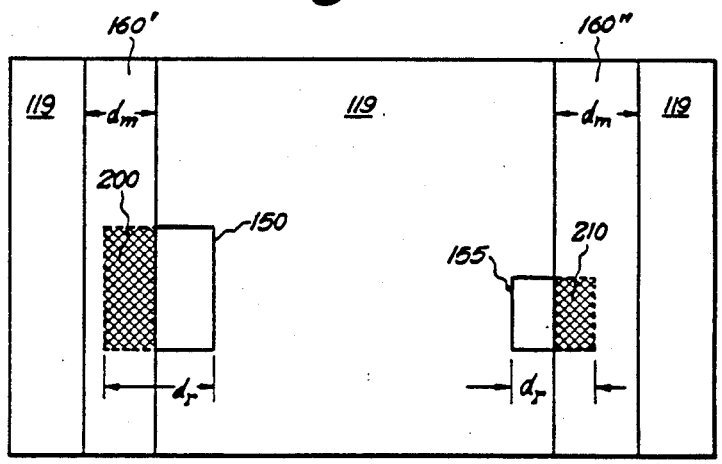
FIG. 21 is a plan view illustrating contact openings and metallization pattern dimensioning in accordance with the present invention.

The final step of the process considered herein is illustrated in FIGS. 19A and 19B. In many respects, an understanding of these two figures provides the greatest insight into the advantages gained by the present invention. In particular, interconnection metallization layer 160 is etched away in a mask-based process to form interconnection leads 160' and 160", as shown in FIGS. 19A and 19B. It is noted that lead 160' shorts or ties the gate electrode to the source electrode. It is desired that the width of these lines or "wires" be as thin as possible. However, without the use of intermediary contact metal 140s or 140d, alignment of the metallization pattern becomes more critical. For example, as illustrated in the righthand portion of FIG. 21, the metallization pattern may be so as to contact the silicon in only small contact areas such as are indicated by doubly hatched regions 200 and 210. This would result in high contact resistance and poor circuit properties in the absence of the intermediary contact metal. In the worst case, it could result in a circuit device or chip failure. However, the lower resistance connection provided by the intermediary contact metal which has been selectively deposited on the silicon areas, alleviates this concern to a very significant degree. Prior art solutions to this contact problem have involved framing the interconnection metallization patterns in the vicinities of the dielectric layer vias in the manner illustrated in FIG. 20. This decreases effective spacing between adjacent metallization patterns to the value $d_2$, as shown. Accordingly, the desire to shrink distance $d_1$ is limited by the effectively shorter distance $d_2$. Accordingly, the present invention provides unframed metal contacts. These contacts, are more particularly illustrated in FIGS. 19A, 19B, and 21. In FIGS. 19B and 21 particularly, doubly cross-hatched areas 170, 171, 175, 200, and 210 illustrate areas of contact between interconnection metal 160 and intermediary contact metal layer 140.

With regard to FIG. 21 particularly, it is seen that the present invention permits the width of interconnection metal pattern $d_m$ to actually be smaller than the width of the via opening, namely $d_r$. Additionally, the placement of the interconnection metallization lines is much less severely restricted.

The structure which results from etching of interconnection metallization layer 160 is shown in cross-section in FIG. 19A and in plan view in FIG. 19B. As above, substratal structures which are present, but hidden, are shown with dotted lines while structures which are visible through via openings are shown in full. The metallization pattern is formed from metallization layer 160 in a fourth masking operation together with conventional photoresist developing and etching methods. With respect to the etching of the interconnection metallization pattern, it is noted that selective metal etching is generally preferred. Accordingly, if the contact metal layer 140 comprises tungsten, it is generally preferred that the interconnection metal layer comprise a different metal so that any intermediate contact metal exposed to the etchant is not removed. However, in those circumstances in which the selectively deposited contact metal is made thicker than the interconnection metal layer, then it is possible to employ the same metal in both the interconnection layer and in the selectively deposited contact layer.

Figure 22:
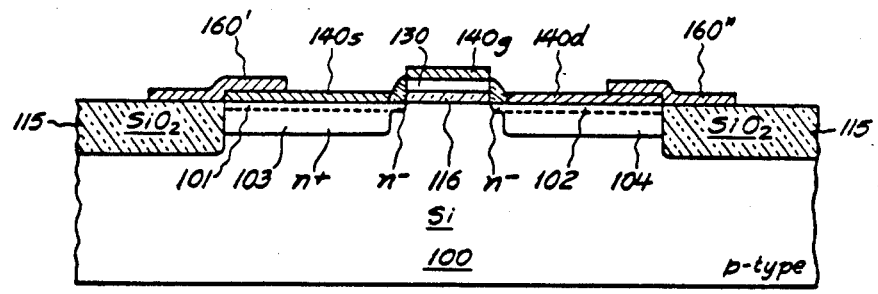
FIG. 22 illustrates a cross-sectional view of an alternative embodiment of the invention.

Yet another embodiment of the present invention is illustrated in FIG. 22. In this embodiment, it is seen that interconnection metallization patterns 160' and 160" are not applied through contact vias, but rather are directly deposited in contact with intermediate contact metal 140s and 140d, respectively. As above, the improved contact resistance between the interconnection metal and the intermediate metal provides alignment advantages not heretofore found in the integrated circuit semiconductor arts. It is seen that even if metallization layers 160' or 160" are somewhat displaced either to the left or to the right, sufficiently low contact resistance is maintained so as to provide the desired degree of contact with the underlying doped silicon source and drain regions. As above, it is seen that unframed metal contacts are therefore employable and that this serves to decrease the pitch or spacing between interconnection metallization lines.

It will be appreciated by those skilled in the art that it is also possible to fabricate the device shown in FIGS. 19A and 19B by a sequence of process steps in which contact metal 140s or 140d is deposited subsequent to the formation of contact vias in dielectric layer 119.

A number of advantages follow from the method and configuration of the present invention. For example, the area of contact with the semiconductor material can be made to be greater than the area of contact between the interconnect metallization and the intermediary contact metal. This tends to provide a higher device yield. Additionally, the speed, power dissipation, and reaction time of the individual devices on a chip are improved. Moreover, it is possible to produce a structure in which a lead in the interconnection metallization network is not constrained to cover the entire contact window opening. This permits closer line spacing between conductors in the interconnection metallization pattern. In one embodiment of the present invention, one half of the difference between the width of the via and the width of the interconnection metal pattern is less than or equal to the alignment tolerance for the metallization pattern. Moreover, through the selective deposition of sufficiently thick contact metal patterns, it is possible to employ the same metal, preferably tungsten, in the interconnection layer as in the contact layer. And of course, the design of the present invention totally precludes the necessity for framing contact opening windows in the interlayer dielectric material. It should be noted that while the description herein has been directed toward the utilization of silicon as a semiconductive material, the method and configuration of the present invention are not limited to silicon VLSI processes, but rather also include other semiconductive materials such as gallium-arsenide.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A semiconductor device with improved metallization patterning, said device comprising:
   a conductive region of semiconductor material of one type conductivity;
   a layer of insulative material overlying said conductive region of semiconductor material, said insulative layer having at least one opening therein;
   a contact enhancement layer of tungsten, disposed within said at least one opening, in ohmic electrical contact with said conductive region of semiconductor material, said contact enhancement layer being self-aligned to either said conductive region or said opening; and
   a layer of interconnection metallization disposed in ohmic electrical contact with said contact enhancement layer with said interconnection metallization being disposed so as to only partially overlie said contact enhancement layer, said interconnection metallization having a width less than a width of said opening.

2. The device of claim 1 in which said interconnection metallization and said contact enhancement layer metal comprise distinct materials.

3. The device of claim 1 in which said interconnection metallization comprises tungsten and said contact enhancement layer metal is sufficiently thick so as not to be completely removable by patterning of said interconnection metallization.

4. The device of claim 1 in which a portion of said contact enhancement layer is not covered by said interconnection metallization.

5. The device of claim 1 in which said semiconductor material is selected from the group consisting of silicon and gallium-arsenide.

6. A semiconductor device with improved metallization patterning, said device comprising:
   a conductive region of semiconductor material of one type conductivity;
   a layer of insulative material overlying said conductive region of semiconductor material, said insulative layer having at least one opening therein;
   a contact enhancement layer disposed within said opening in ohmic electrical contact with said conductive region of semiconductor material, said contact enhancement layer comprising material selected from the group consisting of platinum silicide and palladium silicide and being self aligned to said conductive region; and
   a layer of interconnection metallization disposed in ohmic electrical contact with said contact enhancement layer in said opening with said interconnection metallization being disposed so as to only partially overlie said contact enhancement layer, said interconnection metallization having a width less than a width of said opening.

7. The device of claim 6 in which said interconnection metallization and said contact enhancement layer material comprise distinct materials.

8. The device of claim 6 in which said contact enhancement layer is sufficiently thick so as not to be completely removable by patterning of said interconnection metal.

9. The device of claim 6 in which a portion of said contact enhancement layer is not covered by said interconnection metallization.

10. The device of claim 6 in which siad semiconductor material is selected from the group consisting of silicon and gallium-arsenide.

11. A semiconductor device with improved metallization patterning, said device comprising:
    a conductive region of semiconductor material of one type conductivity;
    a contact enhancement layer disposed in ohmic electrical contact with said conductive region of semiconductor material, and self aligned to said conductive region; and
    a layer of interconnection metallization directly disposed in ohmic electrical contact with said contact enhancement layer, without being deposited through a contact hole formed in a layer of insulation material and with said interconnection metallization being disposed so as to only partially overlie said contact enhancement layer.

12. An unframed contact configuration for use in integrated circuit devices, said configuration comprising:
    a conductive region of semiconductor material of one type conductivity;
    a layer of insulative material overlying said conductive region of semiconductor material and having at least one opening therein;
    a layer of contact enhancement material selectively disposed within said at least one opening in ohmic electrical contact with said conductive region of semiconductor material and self-aligned to said conductive region; and
    a layer of interconnection metallization in ohmic electrical contact with said contact enhancement layer, said interconnection metallization layer not being wider than said at least one opening, said contact enhancement layer providing a lower contact resistance between said interconnection metallization layer and said conductive region.

13. An unframed contact configuration for use in integrated circuit devices, said configuration comprising:
    a conductive region of semiconductor material of one type conductivity;
    a layer of contact enhancement material selectively disposed in ohmic electrical contact with said semiconductor material and self-aligned to said conductive region;
    a layer of interconnection metallization disposed at least partially over and in electrical contact with said contact enhancement layer, said interconnection metallization layer in the vicinity of said contact enhancement layer not being wider than the metallization layer leading to said contact enhancement layer to improve packing density.

14. The device of claim 1 in which said contact enhancement layer substantially completely covers said semiconductor material exposed through said opening.

15. The device of claim 6 in which said contact enhancement layer substantially completely covers said semiconductor material exposed through said opening.

16. The device of claim 11 in which said contact enhancement layer substantially completely covers said conductive region of said semiconductive material.

17. The configuration of claim 12 in which said layer of contact enhancement material substantially completely covers said semiconductor material exposed through said opening.

18. The configuration of claim 13 in which said layer of contact enhancement material substantially completely covers exposed portions of said semiconductor material.

19. A semiconductor device with improved metallization patterning, said device comprising:
- a conductive region of semiconductor material of one type conductivity;
- a layer of insulative material overlying said conductive region of semiconductor material, said insulative layer having at least one opening therein;
- a contact enhancement layer of tungsten, selectively disposed in ohmic electrical contact with said conductive region of semiconductor material, said contact enhancement layer being self-aligned to said at least one opening; and
- a layer of interconnection metallization disposed in ohmic electrical contact with said contact enhancement layer, said interconnection metallization exhibiting a width which is approximately the same as or less than the width of said at least one opening, said contact enhancement layer providing a lower contact resistance between said interconnection metallization layer and said conductive region.

20. A semiconductor device with improved metallization patterning, said device comprising:
- a conductive region of semiconductor material of one type conductivity;
- a layer of insulative material overlying said conductive region of semiconductor material, said insulative layer having at least one opening therein;
- a contact enhancement layer selectively disposed within said opening in ohmic electrical contact with said conductive region of semiconductor material, said contact enhancement layer comprising material selected from the group consisting of platinum silicide and palladium silicide and being self aligned to said conductive region; and
- a layer of interconnection metallization at least partially overlying said insulative layer and disposed in ohmic electrical contact with said contact enhancement layer in said opening, said interconnection metallization layer exhibiting a width which is approximately the same as or less than the width of said opening, at least in the vicinity of said opening to improve packing density.

21. A semiconductor device with improved metallization patterning, said device comprising:
- a conductive region of semiconductor material of one type conductivity;
- a contact enhancement layer selectively disposed in ohmic electrical contact with said conductive region of semiconductor material, and self aligned to said conductive region; and
- a layer of interconnection metallization at least partially overlying said contact enhancement layer and disposed in ohmic electrical contact with said contact enhancement layer, said interconnection metallization exhibiting a width which is approximately the same as or less than the width of said contact enhancement layer, at least in the vicinity of contact between said interconnection metallization and said contact enhancement layer to improve packing density.

* * * * *